Figure 1A:
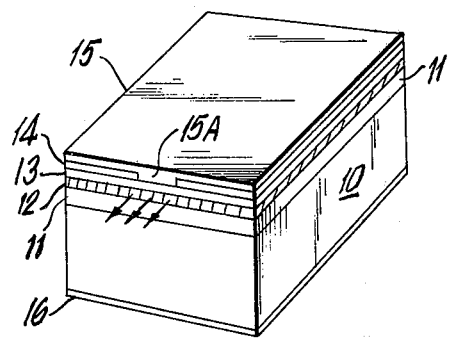

United States Patent [19]

Hayashi et al.

[11] 3,983,510

[45] Sept. 28, 1976

[54] SEMICONDUCTOR DOUBLE HETEROSTRUCTURE LASER DEVICE AND METHOD OF MAKING THE SAME

[75] Inventors: Izuo Hayashi; Yasuo Nannichi, both of Tokyo, Japan

[73] Assignee: Nippon Electric Company, Ltd., Tokyo, Japan

[22] Filed: June 6, 1975

[21] Appl. No.: 584,405

[30] Foreign Application Priority Data

June 11, 1974 Japan................................ 49-66733

[52] U.S. Cl........................ 331/94.5 H; 29/576 E; 148/175; 156/17; 357/18
[51] Int. Cl.² ................... H01L 21/208; H01S 3/19
[58] Field of Search................. 331/94.5 H; 357/18; 148/171, 175; 156/17; 29/576, 584

[56] References Cited
UNITED STATES PATENTS 3,833,435  9/1974  Logan et al................ 331/94.5 H X

*Primary Examiner*—Eugene La Roche
*Attorney, Agent, or Firm*—Hopgood, Calimafde, Kalil, Blaustein & Lieberman

[57] ABSTRACT

A strip-geometry semiconductor double-heterostructure laser device includes an n-GaAs substrate on which a first layer of n-$Al_xGa_{1-x}As$ and a second layer of p-$Al_yGa_{1-y}As$ are formed by epitaxial growth techniques. A third layer of heat- and Ga melt resistant material of narrow stripe geometry is formed on the second layer. After the second layer and part of the first layer, except for their stripe portions, are meltbacked by Ga melt liquid, a fourth layer of n-$Al_zGa_{1-z}As$ is formed by epitaxial growth techniques of the same Ga melt liquid in one process.

6 Claims, 9 Drawing Figures

SEMICONDUCTOR DOUBLE HETEROSTRUCTURE LASER DEVICE AND METHOD OF MAKING THE SAME

The present invention relates generally to stripe-geometry semiconductor lasers, and more particularly to such lasers of the type using a semiconductor double heterostructure and to methods of making such laser devices.

Techniques are known for fabricating double heterostructure semiconductor lasers of the type comprising a GaAs or $Al_yGa_{1-y}As$ active layer sandwiched between p-type and n-type $Al_xGa_{1-x}As$ layers (where $x>y$). This type of laser operates with a far lower laser-oscillation initiating current (i.e., threshold current) than the type using a homojunction and can provide laser oscillation continuously at room temperature. To minimize the threshold current, improvements have been made to the planar structure in which all the laser exciting current flows through the active layer, as well as to the stripe-geometry structure in which the flow of the current is limited to a narrow stripe region which is a very small part of the active layer. A number of stripe-geometry semiconductor lasers have been proposed with the aim of reducing the threshold current density and limiting the width of the output laser beam, thereby to confine laser oscillation to a lower order mode. Four stripe-geometry semiconductor lasers are typically known: the oxide stripe type proposed by C. J. Dyment in Applied Physics Letter, Vol. 10, pp. 84–86, February 1967; the proton bombardment stripe type proposed by C. J. Dyment et al in Proceedings of The IEEE, Vol. 60, pp. 726–728, June 1972; the mesa stripe type proposed by T. Tsukada et al in Applied Physics Letter, Vol. 20, pp. 344–345, May 1972; and the planar stripe type proposed by H. Yonezu et al in Japanese Journal of Applied Physics, Vol. 12, No. 10, pp. 1585–1592, October 1973.

As described in these and other articles, the prior art techniques have realized markedly low threshold current densities, extended device life, and a lower laser oscillation mode; however, they have failed to confine laser oscillation within a sufficiently narrow stripe region, with the result that it has been heretofore extremely difficult to lead a laser output into an optical transmission body, such as an optical fiber whose crossection is very small. Furthermore, in the prior art structures, it is impossible to lower the threshold current density below a certain level if the stripe region width is excessively narrowed. In practice, the threshold current density increases sharply when the stripe width is narrowed below a certain critical value. As will be described later, the threshold current level and the stripe region width have lower limits, and narrowing the stripe region width below its limit will not contribute to lowering the threshold current level and reducing the width of the output laser beam. The minimum threshold current available with the prior art structures is normally 100 mA, or experimentally 30 mA at best, against a minimum stripe region width of 10 to 30 $\mu m$.

It is therefore an object of the invention to provide a semiconductor double heterostructure laser in which the stripe region width and the threshold current are reduced below conventionally impracticable limits, thereby confining the laser oscillation to a lower mode and extending the life of the device.

With this and other objects in view, the invention provides a stripe-geometry semiconductor double-heterostructure laser device having a stripe active region formed without the need for withdrawing the crystal strip out of the liquid epitaxial growth oven by utilizing selective meltback techniques.

Figure 1B:
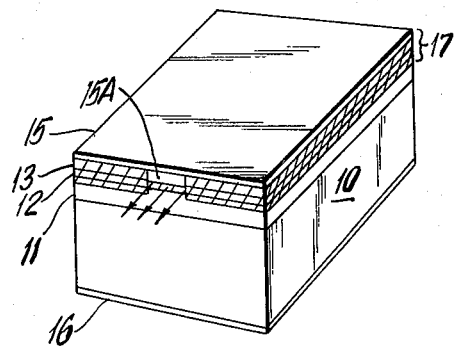
Figure 1C:
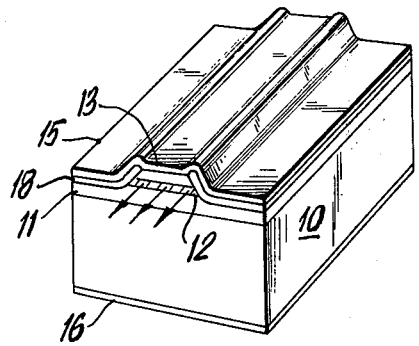
Figure 1D:
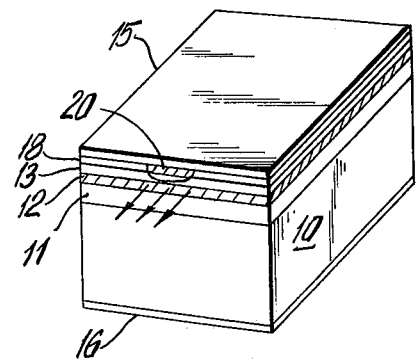
Figure 2:
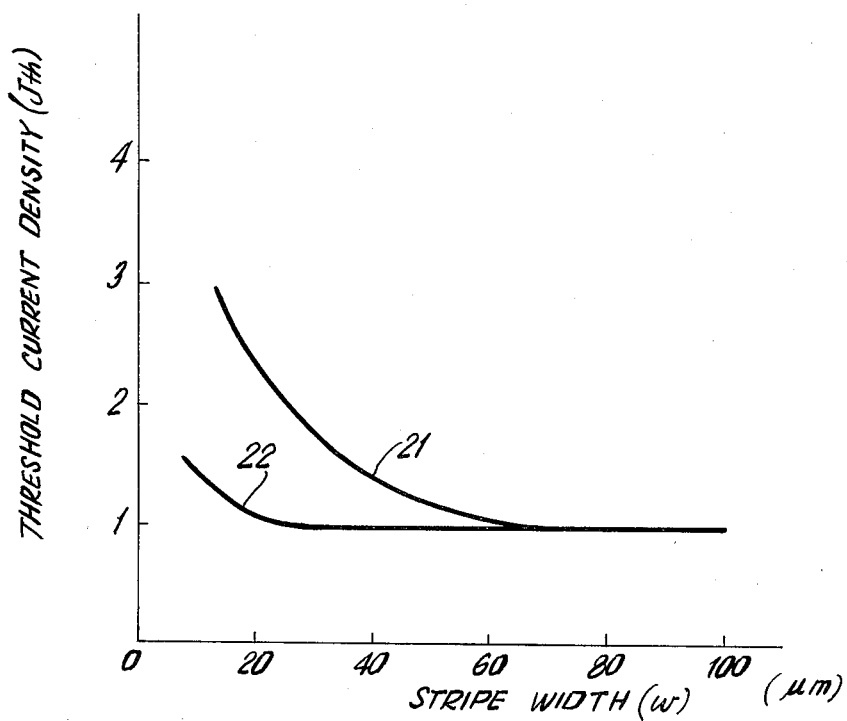
Figure 4:
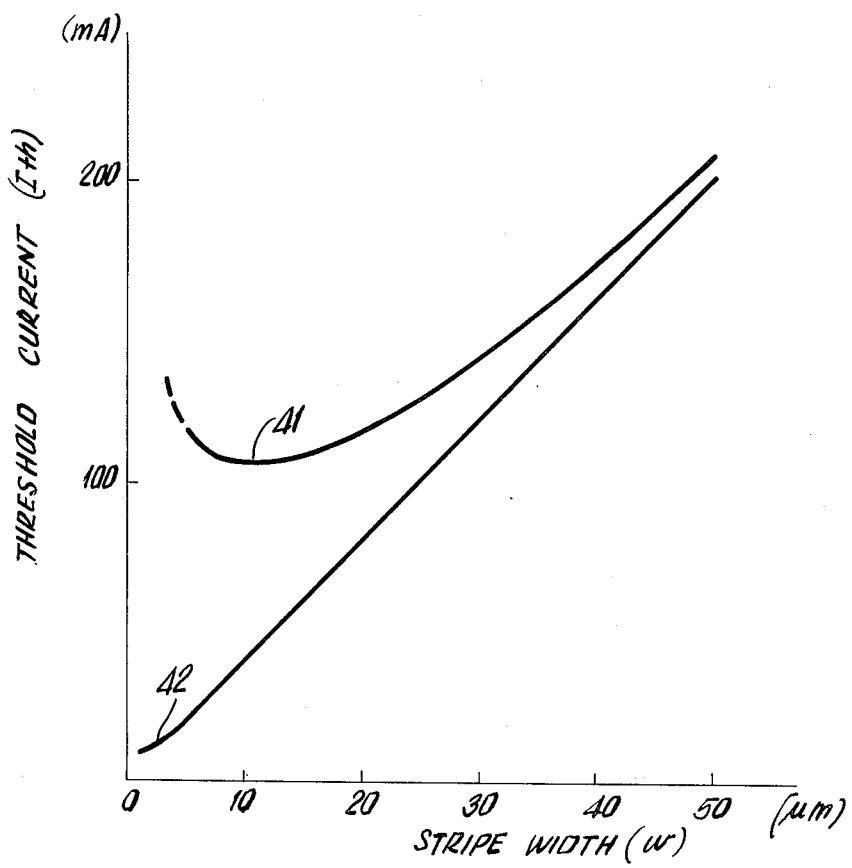

The other objects, features and advantages of the invention will become more apparent from the following detailed description when read in conjunction with the accompanying drawings wherein:

FIGS. $1(a)$ - $1(d)$ are perspective views of prior art stripe-geometry heterostructure semiconductor laser devices, FIG. 2 is a graphic diagram illustrating the operating characteristics of the prior art laser devices shown in FIG. 1, FIGS. $3(a)$ through $3(c)$ are perspective views of a semiconductor laser device fabricated according to the invention, and FIG. 4 is a graphic diagram illustrating the operating characteristics of the laser device shown in FIG. 3.

With reference to FIG. 1, the constructions of four typical prior art stripe semiconductor laser devices are shown FIG. $1(a)$ illustrates the oxide stripe type FIG. $1(b)$ illustrates the proton bombardment type, FIG. $1(c)$ illustrates the mesa stripe type, and FIG. $1(d)$ illustrates the planar stripe type.

In FIG. $1(a)$, the oxide stripe type of semiconductor laser device comprises an n-GaAs substrate 10; an n-$Al_xGa_{1-x}As$ layer 11, a p-GaAs layer (active layer) 12, and a p-$Al_yGa_{1-y}As$ layer 13 which are formed in sequence on the substrate 10 by liquid epitaxial growth techniques. A pair of $SiO_2$ layers 14 is formed on the $Al_yGa_{1-y}As$ layer, with a narrow stripe gap separating the $SiO_2$ layers from each other, and a conductor layer is 15 formed on the exposed part (i.e., the narrow stripe part) of the layer 13 and on the entire surfaces of the $SiO_2$ layers 14. On the bottom of the substrate 10 is an ohmically contacting conductor layer 16 which serves as an electrode. A pair of outer sides perpendicular to the stripe are set up by cleavage, thus forming an optical resonator. When a forward voltage is applied between the conductor layers 15 and 16, a forward current flows in the stripe region 15A having direct contact with the layer 13. This current, when it reaches a threshold value, brings about laser oscillation. In this type of laser device, the stripe-geometry oscillation region depends on the shape of the stripe portion 15A, and the active region 12 is continuous in the planar direction, with the result that the oscillated light unavoidably leaks out into the adjacent regions. This has set lower limitations on the threshold current.

The proton bombardment type of semiconductor laser device shown in FIG. $1(b)$ comprises an n-GaAs substrate 10, an n-$Al_xGa_{1-x}As$ layer 11, a p-GaAs layer (active layer) 12, and a p-$Al_yGa_{1-y}As$ layer 13 which are formed on the substrate 10 in the same manner as in FIG. $1(a)$. With the stripe portion 15A masked, the layer 13 is exposed to proton bombardment to form a high resistance region 17 reaching part of the n-$Al_xGa_{1-x}As$ layer 11. Then conductor layers 15 and 16 are formed in the same manner as in FIG. $1(a)$. In such structure, the flow of an exciting current as a result of the application of a forward voltage between the conductor layers 15 and 16 is limited to the stripe portion 15A because of the high resistance region 17. In this type of laser device, however, laser oscillation cannot be confined to a substantially narrow stripe region.

The mesa stripe type of semiconductor laser device as shown in FIG. $1(c)$ is similar in construction to the ones shown in FIGS. 1(a) and 1(b), and comprises a substrate 10, and layers 11 through 13 formed on the substrate by epitaxial growth techniques. The region which is to become the stripe portion 15A is masked, and the layer 13 is chemically etched as far as part of the layer 11 to form a stripe mesa region. The etched crystal surface, except for the flat surface of the mesa region, is coated with a silicon phosphate glass film. Then a conductor layer 15 is formed on the entire surface thereof. This type of laser device requires the use of intricate processes to fabricate, although leakage of oscillated light from the stripe region is fairly effectively prevented.

The planar stripe type of semiconductor laser device as shown in FIG. 1(d) is similar in construction to the foregoing types, and further comprises an n-$Al_zGa_{1-z}As$ layer 19 formed on the p-$Al_yGa_{1-y}As$ layer 13 and diffused as far as part of that layer to form a stripe Zn diffusion region 20. Then a conductor layer 15 is formed on the entire surface of the layer 19. In such construction, when a positive voltage is applied to the conductor layer 15 across the conductor layer 16, the region between the third and fourth layers 13 and 19 except for the Zn diffusion region 20 is reverse biased to hamper current from flowing therethrough. The diffusion region 20 is forward biased to allow current to flow in this region, thus serving as the stripe laser oscillation region of the device. Although this laser device can be manufactured by relatively simple processes, leakage of oscillated light from the stripe region cannot be minimized because the active layer 12 is continuous in the planar direction as in the oxide stripe type laser.

FIG. 2 is a graph in which the abscissa represents the width (w) of the stripe portion 15A as in FIGS. 1(a), 1(b) and 1(c), or 20 as in FIG. 1(d); and the ordinate represents a minimum current necessary to initiate a laser oscillation, i.e., the threshold current, divided by the area of the stripe electrode, that is, the apparent threshold current density (Jth). The value (w) does not signify the width of the stripe active region which is directly related to laser oscillation; it is the width of the stripe portion 15A or 20.

In the oxide stripe type of semiconductor laser device, current spreads in the planar direction in the active layer 12 and the third layer 13 as described previously. Hence, with a decrease in the width (w), the apparent threshold current density (Jth) increases at a higher ratio than in the planar structure. The curve 21 indicates an example of threshold current density observed in the oxide stripe type of semiconductor laser device.

In the proton bombardment stripe type of semiconductor laser device, the threshold current density (Jth) increases with decrease in the width (w), in a ratio smaller than in the oxide stripe type but greater than in the mesa stripe type. In the mesa stripe type of semiconductor laser device, the width (w) is approximately equal to the width of the effective active layer since the width of the stripe active layer is defined by the boundary between the crystal and the phosphosilicate glass film. Further, in the mesa stripe type of semiconductor laser device, losses such as those resulting from leakage of laser light are minimized because the difference in refraction index between the AlGaAs layer and the silicon phosphate glass layer is so great that the generated laser light is totally reflected from the boundary between these layers. Furthermore, current is kept from spreading out of the stripe region 15A due to the mesa structure. Accordingly, the ratio in which the threshold current density (Jth) increases with a decrease in the width (w) is smaller in the mesa stripe type, and the threshold current density (Jth) increases with a decrease in the width (w) as indicated by the curve 22. This is considered because of light reflection by the etched surface, crystalline defects due to etching, and so forth. In the planar stripe type of semiconductor laser device, the current spreading effect is slightly smaller than in the oxide stripe type but the planar stripe type is advantageous over the mesa stripe type with respect to heat sink characteristic and crystalline defect. As for the threshold current density (Jth) versus width (w) characteristic, the planar stripe type of semiconductor laser device is the second best after the mesa stripe type. In addition, the planar stripe type can offer the longest continuous laser oscillation at room temperature among the four types of semiconductor lasers.

Figure 3A:
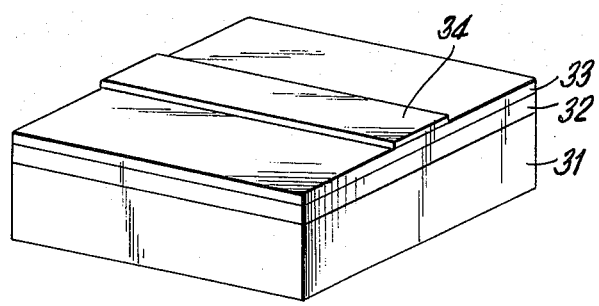
Figure 3B:
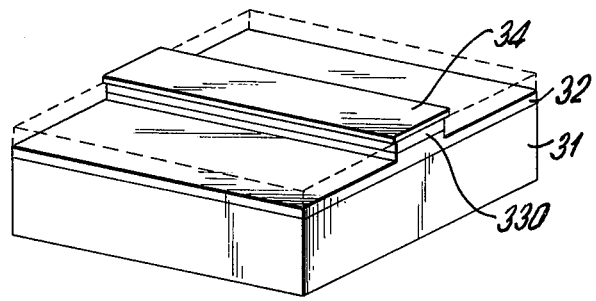
Figure 3C:
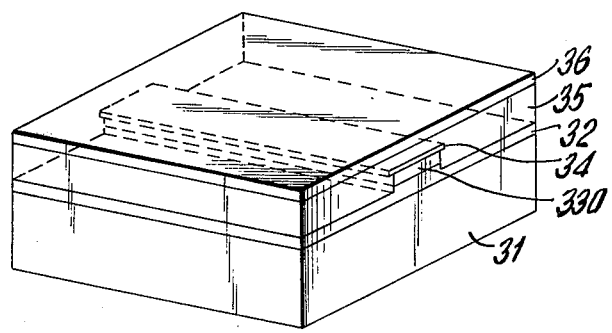

FIG. 3, illustrates a laser device fabricated according to the invention. As shown in FIG. 3(a), first Ga melt liquid is brought into contact with one surface of an n-GaAs substrate 31 to form an n-$Al_xGa_{1-x}As$ layer 32 by known liquid epitaxial growth techniques. A second Ga melt liquid is brought into contact with the layer 32 to form a p-$Al_yGa_{1-y}As$ ($0 \leq y < x$) layer 33 to a thickness of 0.1 to 1.0 μm by liquid expitaxial growth techniques. Then the crystal is withdrawn from the liquid epitaxial growth apparatus, and an $Al_2O_3$ layer 34 is formed in a stripe geometry to a thickness of several tens to 1000A on the layer 33 by CVD or aluminum oxidation techniques as shown in FIG. 3(a). Instead of $Al_2O_3$, the layer 34 may be formed of silicon oxide, silicon nitride, silicon carbide, tantalum oxide, oxide of AlGaAs itself, or the like which is highly resistant to heat and Ga melt liquid. The crystal strip is placed in the liquid epitaxial growth apparatus in which a third Ga melt liquid is brought into contact with the crystal surface at a temperature of 830°C. Then the temperature is raised by 1°C, and the crystal is meltbacked by the Ga melt liquid as far as part of the layer 32 except for the masked area of the $Al_2O_3$ layer 34 as shown in FIG. 3(b). The crystal is gradually cooled by 3°C at a rate of 0.1°C per minute whereby an $Al_zGa_{1-z}As$ ($y < z$, $x = z$ inclusive) layer 35 is formed. A fourth Ga melt liquid is brought into contact with the layer 35 at a temperature of 28°C to form a p-GaAs layer 36 to a thickness of about 1 μm as shown in FIG. 3(c). The stripe portion 330 remains after meltback owing to the presence of the $Al_2O_3$ mask layer 34. This stripe portion, together with the $Al_2O_3$ layer 34, is surrounded with the n-$Al_xGa_{1-x}As$ layer 32 and the p-$Al_zGa_{1-z}As$ layer 35. In this structure, therefore, the spread of current and leakage of oscillated light which are encountered in the prior art laser devices is prevented.

In the above described forming process, the layer 35 is formed epitaxially while the third Ga melt liquid remains in contact with the top surface of the layer 32 and the sides of the stripe portion 330. As a result, the presence of defects is minimized in the boundary between the layers 35 and 32 and the stripe portion 330. Meltback beneath the $Al_2O_3$ layer 34 progresses not only in the thickness direction of epitaxially grown layers 32 and 33 but toward the center of the mask layer 34. This makes the width of the active region stripe portion 330 narrower than that of the mask layer 34. In experiments, performed on a semiconductor laser device fabricated according to the invention, a stripe active region narrower by about 1 μm than the mask layer 34 has been realized.

In the semiconductor laser of this invention, the energy gap of the active region of stripe portion 330 is about 1.4 to 1.6 eV, though partly depending on the content of aluminum. Because this value is smaller than the energy gap (about 1.8 to 1.9 eV) of the region of layers 32 and 35, the oscillation current flows in the n-type layer 32 not directly from the p-type layer 35 but through the active region of stripe portion 330. Also, because the refraction index of the active region of stripe portion 330 is about 3.5 which is about 3% larger than that of the layers 32 and 35, leakage of the laser light from the active region can be prevented. Thus, according to the invention, the path of the exciting current can be limited and the leakage of oscillated laser light from the active region can be prevented, with the result that the threshold current (Ith) decreases nearly proportional to the width of the laser resonator, and continuous laser oscillation is maintained at room temperature under the application of a current as small as 10 mA or less, which is one-tenth of the current required in the prior art laser devices.

With reference to FIG. 4, a graph is shown to illustrate the operating characteristics of the laser device of the invention, with the abscissa representing the stripe width (w), and the ordinate the threshold current (Ith) a curve 42 demonstrating the relationship between the stripe width and threshold current of the laser device invention is shown in comparison with a curve 41 of this characteristic for a prior art planar type of semiconductor laser device. The graph of FIG. 4 evidences the fact that in the laser device according to the present invention the threshold current decreases proportionally to a decrease in the stripe width, free of a lower limit on the stripe width which would have been removed in the art of stripe semiconductor laser devices. The characteristic 42 has been measured of a specimen with an active region of 0.15 μm in thickness and 300 μm in length.

In the laser device of the invention, as described, the active region can be confined to a size of less than 0.2μm in thickness and less than 1μm in width, to make it possible to confine laser oscillation to a fundamental mode not only in the direction perpendicular to the plane of the active region but in the direction parallel to it. In other words, the laser device of the invention can serve substantially as a point light source, thus permitting its laser output to be easily coupled to an optical system or an optical transmission system with high efficiency.

Furthermore, in the laser device of the invention, the threshold current (Ith) can sufficiently be reduced by narrowing the width of the stripe active region and hence heat produced in the crystal can be minimized. Still further, the fact that heat production is limited to a very narrow region contributes much to simplifying the heat sink. More specifically, a heat sink member may be installed on the side of substrate, instead of the top conductor side as in the prior art structure, without sacrificing heat sink effect. This feature of the invention signifies much simpler laser pellet packaging than is available with prior art techniques and leads to greater freedom in the design and fabrication of optical integrated circuits. Furthermore, heat produced in the crystal is so small in absolute value that the material of the heat sink member may be chosen from among such materials as silicon instead of conventional heat conducting materials such as copper and diamond. This further helps to enhance design freedom. In addition, in the laser device of the invention, the distance from the heat sink to the region where heat is produced can be elongated to enable the temperature gradient of the device to be minimized, thereby minimizing degradation of the constituent elements and maximizing the life of the device.

While one specific embodiment of the invention and a few modifications thereof have been specifically described it is to be understood that numerous variations may occur to those skilled in the art without departing from the spirit of the invention.

What is claimed is:

1. A method of making a stripe-geometry semiconductor double-heterostructure laser device comprising the steps of:
   a. providing an n-GaAs substrate;
   b. liquid-epitaxially growing a first layer of n-$Al_xGa_{1-x}As$ on one surface of said substrate;
   c. epitaxially growing a second layer of p-$Al_yGa_{1-y}As$ on said first layer;
   d. forming a third layer of heat- and Ga melt-resistant material of narrow stripe geometry on said second layer; and
   e. bringing a gallium melt liquid of a composition to be formed into a fourth layer of n-$Al_zGa_{1-z}As$ on said second layer into contact with said second and third layers, said second layer except for the area coated with said third layer, and part of said first layer in the thickness direction being meltbacked by Ga melt liquid, and then forming said fourth layer by epitaxial growth techniques.

2. The method of claim 1, in which said heat and Ga melt-resistant material is selected from the group consisting of aluminum oxide, silicon oxide, silicon nitride, silicon carbide, tantalum oxide, and an oxide of AlGaAs.

3. The method of claim 1, in which step (e) also includes the step of first increasing the temperature of the crystal prior to meltbacking and thereafter gradually decreasing the temperature of the crystal to form said fourth layer.

4. The method of claim 3, further including the step of bringing a second gallium melt liquid into contact with said fourth layer to form a fifth p-GaAs layer on said fourth layer.

5. A stripe-geometry semiconductor doubleheterostructure laser device including:
   an n-GaAs substrate;
   a first layer of n-$Al_xGa_{1-x}As$ and a second layer of p-$Al_yGa_{1-y}As$, formed on one surface of said substrate, by liquid epitaxial growth techniques;
   a third layer of heat- and Ga melt-resistant material of narrow stripe geometry formed on said second layer;
   a fourth layer of n-$Al_zGa_{1-z}As$ formed by epitaxial growth techniques after said second layer and part of said first layer in its thickness direction, except for the stripe portions of said first and second layers, are meltbacked by Ga melt liquid; and
   conductor layers in ohmic contact with the other surface of said substrate and with the surface of said fourth layer, respectively.

6. The laser device of claim 5, in which said heat and Ga melt-resistant material is selected from the group consisting of aluminum oxide, silicon oxide, silicon nitride, silicon carbide, tantalum oxide, and an oxide of AlGaAs.

* * * * *